United States Patent
Chen et al.

(10) Patent No.: US 6,699,380 B1
(45) Date of Patent: Mar. 2, 2004

(54) MODULAR ELECTROCHEMICAL PROCESSING SYSTEM

(75) Inventors: Guan-Shian Chen, Sunnyvale, CA (US); Michael X. Yang, Palo Alto, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/274,721

(22) Filed: Oct. 18, 2002

(51) Int. Cl.[7] .......................... C25D 5/34; C25D 5/48; C25D 17/00
(52) U.S. Cl. ................ 205/205; 205/220; 205/640; 204/198; 204/224 R; 204/224 M; 204/269
(58) Field of Search ...................... 204/198, 224 R, 204/224 M, 269; 205/205, 220, 640

(56) References Cited

U.S. PATENT DOCUMENTS

| | | | | |
|---|---|---|---|---|
| 5,733,420 A | * | 3/1998 | Matsuda et al. | 204/203 |
| 5,934,856 A | * | 8/1999 | Asakawa et al. | 414/217 |
| 6,071,055 A | * | 6/2000 | Tepman | 414/217 |
| 6,254,760 B1 | | 7/2001 | Shen et al. | 205/335 |
| 6,258,220 B1 | | 7/2001 | Dordi et al. | 204/198 |
| 6,258,223 B1 | | 7/2001 | Cheung et al. | 204/242 |
| 6,267,853 B1 | | 7/2001 | Dordi et al. | 204/232 |
| 6,338,874 B1 | | 1/2002 | Law et al. | 427/255.18 |
| 2002/0036065 A1 | | 3/2002 | Yamagishi, et al. | 156/345 |

FOREIGN PATENT DOCUMENTS

JP 58-42794 3/1983 ............ C25D/7/06

* cited by examiner

Primary Examiner—Donald R Valentine
(74) Attorney, Agent, or Firm—Moser, Patterson & Sheridan

(57) ABSTRACT

Embodiments of the invention generally provide a substrate processing system and method. The substrate processing system generally includes two primary components. The first component is an interface section having at least one first substrate transfer robot positioned therein, and the second component is at least one processing module in communication with the interface section, the at least one processing module having a pretreatment and post treatment cell, a processing cell, at a second substrate transfer robot positioned therein. The substrate processing method generally includes transporting a dry substrate to a processing module via a dry interface. Once the substrate is positioned in the processing module, a robot transfers the substrate between a treatment cell and a processing cell contained within the processing module to complete a predetermined sequence of processing steps. Once the processing steps are completed, the treatment cell generally dries the substrate and then the substrate is transferred back to the dry interface.

25 Claims, 4 Drawing Sheets

MODULAR ELECTROCHEMICAL PROCESSING SYSTEM

BACKGROUND OF THE INVENTION

1. Field of the Invention

Embodiments of the invention generally relate to a modular dry in dry out electrochemical processing system.

2. Description of the Related Art

Metallization of sub-quarter micron sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio, i.e., greater than about 4:1, interconnect features with a conductive material, such as copper or aluminum. Conventionally, deposition techniques such as chemical vapor deposition (CVD) and physical vapor deposition (PVD) have been used to fill these interconnect features. However, as the interconnect sizes decrease and aspect ratios increase, void-free interconnect feature fill via conventional metallization techniques becomes increasingly difficult. Therefore, plating techniques, i.e., electrochemical plating (ECP) and electroless plating, have emerged as promising processes for void free filling of sub-quarter micron sized high aspect ratio interconnect features in integrated circuit manufacturing processes.

In an ECP process, for example, sub-quarter micron sized high aspect ratio features formed into the surface of a substrate (or a layer deposited thereon) may be efficiently filled with a conductive material, such as copper. ECP plating processes are generally multistage processes, wherein a substrate is prepared for plating, i.e., one or more preplating processes, brought to a plating cell for a plating process, and then the substrate is generally post treated after the plating process. The preplating process generally includes processes such as depositing a barrier/diffusion layer and/or a seed layer on the substrate, precleaning the seed layer and/or substrate surface prior to commencing plating operations, and other preplating operations that are generally known in the art. Once the preplating processes are complete, the substrate is generally transferred to a plating cell where the substrate is contacted with a plating solution and the desired plating layer is deposited on the substrate. Once the plating processes are complete, then the substrate is generally transferred to a post treatment cell, such as a rinse cell, bevel clean cell, drying cell, or other post treatment process cell generally used in the semiconductor art.

However, one challenge associated with conventional plating systems is that the preplating operations, plating operations, and post plating operations are all generally conducted in separate cells. As such, a substantial amount of time is expended transferring substrates between the respective processing cells. This time required to transfer substrates between the respective processing cells or stations has a detrimental impact upon the system throughput. Furthermore, since several of the processes involved in electrochemical plating are wet processes, the transfer of substrates between processing cells inherently results in dripping, which may contribute to contamination and cell cleaning problems. Therefore, there is a need for an electrochemical plating system configured to minimize the transfer time between substrate pretreatment processes, plating processes, and post plating processes, as well as minimizing or eliminating the contamination and cleaning challenges created by wet substrate transfer processes.

SUMMARY OF THE INVENTION

Embodiments of the invention may provide a substrate processing system, wherein the substrate processing system includes 2 primary components. The first component is an interface section having at least one first substrate transfer robot positioned therein, and the second component is at least one processing module in communication with the interface section, the at least one processing module having a pretreatment and post treatment cell, a processing cell, and a second substrate transfer robot positioned therein.

Embodiments of the invention may further provide a substrate processing system, wherein the processing system includes an interface section having at least one first substrate transfer robot positioned therein, and at least one processing module in communication with the interface section, the at least one processing module having a pretreatment and post treatment cell, a processing cell, and a second substrate transfer robot positioned therein.

Embodiments of the invention may further provide an electrochemical processing system. The processing system may include a factory interface having a substrate transfer robot positioned therein, the factory interface being configured to communicate with at least one substrate containing cassette, and at least one substrate processing module in detachable communication with the factory interface, each of the at least one substrate processing modules including a pretreatment/post treatment cell and an electrochemical processing cell.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a modular dry in dry out type processing system. More particularly, embodiments of the invention generally provide a plurality of substrate processing modules that are interconnected by an interface section. Each of the processing modules are generally configured to receive substrates from the interface section for processing. The interface section, which is often termed a factory interface (FI) in the semiconductor art, generally includes at least one substrate transfer robot configured to transport substrates from a source, i.e., a substrate cassette positioned in communication with the FI, to one or more of the processing modules, and then back to one of the sources. Each of the processing modules generally includes at least two individual processing stations or cells, along with a wet transfer robot positioned within the processing module. For example, each of the processing modules may include a first processing cell or station configured to conduct pre and post plating processes, along with a second processing cell or station configured to conduct plating processes. The processing module robot is generally configured to transfer substrates between the respective cells within the module. Additionally, although not illustrated in the figures, the processing module robot may also be configured to access a substrate handoff point, i.e., a pad may be positioned between the FI robot and the processing module robot so that the FI robot may drop off a substrate for pickup by the processing module robot, and vice versa. Additionally, each of the respective processing modules may have a handoff location that may be used for the robot positioned in the processing module to place a processed substrate on so that the robot in the adjacent interface may then pick up the substrate from the handoff location, which may eliminate problems associated with transferring a substrate from a wet processing blade to a dry processing blade. Therefore, in this configuration, dry substrates may be supplied to the respective processing modules by the FI substrate transfer robot for processing. The dry substrates may be pretreated, plated, and post treated within the processing module, and then the dry substrate may once again be removed from the module by the substrate transfer robot in the FI.

Figure 1:
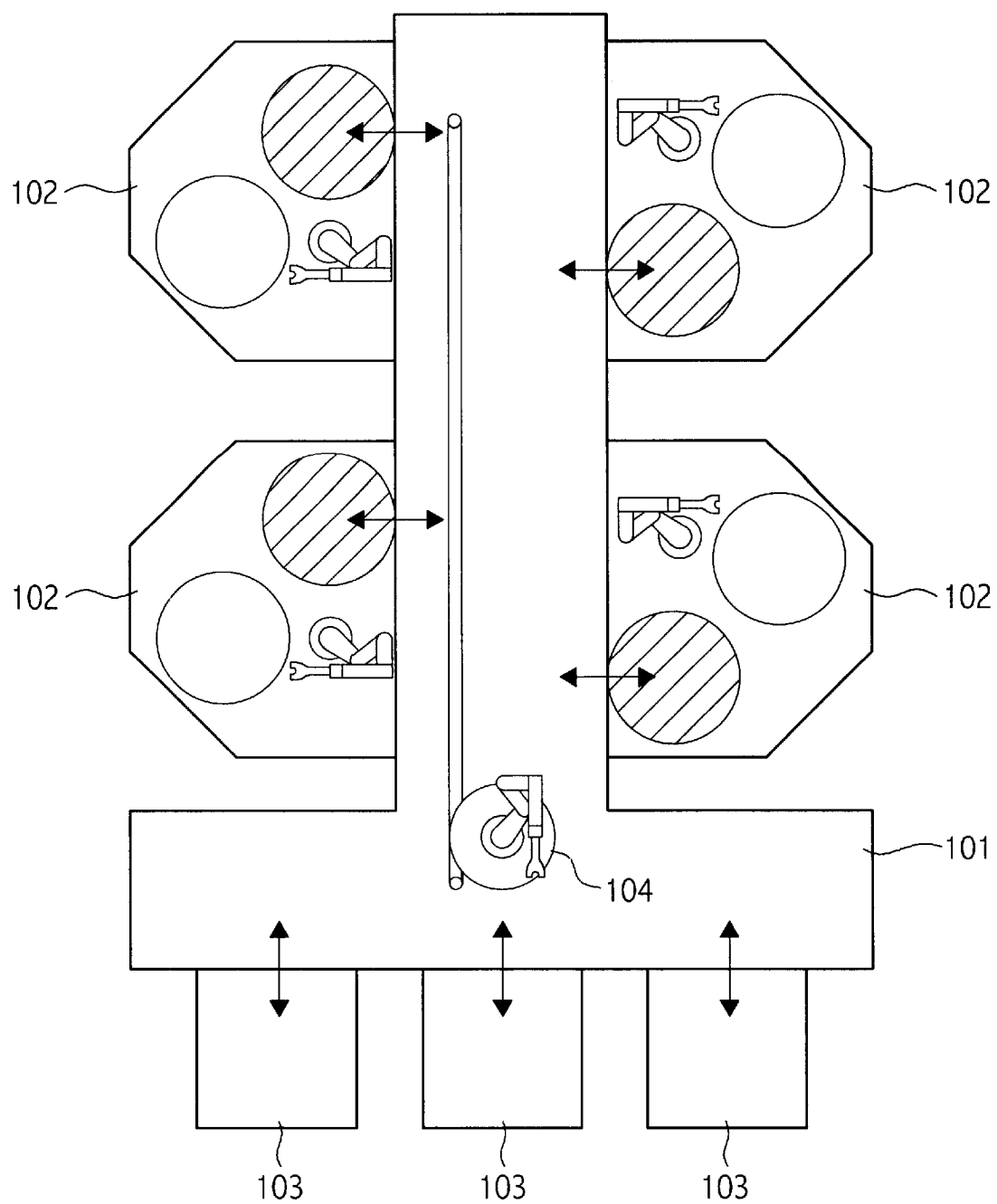
FIG. 1 illustrates a plan view of an exemplary processing system of the invention.

FIG. 1 illustrates a plan view of an exemplary processing system 100 of the invention. Processing system 100, which may be an electrochemical plating system, for example, generally includes an FI 101 and a plurality of processing modules 102. FI 101 is configured to communicate with one or more substrate containing cassettes 103, and more particularly, to remove substrates from the cassettes 103 for processing in system 100, and then when the processing steps are completed, FI 101 is configured to return the processed substrates to one or more of the cassettes 103. In order to accomplish the substrate transfer processes associated with removing/replacing substrates in cassettes 103, FI 101 includes at least one substrate transfer robot 104. Robot 104 may include one or more linear track-type robots, as illustrated in FIG. 1, however, the present invention is not limited to this configuration, and therefore, various robots known in the semiconductor art may be implemented without departing from the scope of the invention. Each of the respective processing modules 102 is in communication with the FI 101, and therefore, each of processing modules 102 may receive and transmit substrates to/from the FI 101. More particularly, each of the respective processing modules 102 may receive substrates from FI 101 for processing and return substrates that have been processed in module 102 to the FI 101 for return to cassettes 103.

Although embodiments of the invention are generally directed to a plurality of processing modules interconnected by a factory interface, the invention is not intended to be limited to this configuration. For example, conventional semiconductor processing systems have implemented a FI in conjunction with a substrate transfer chamber or enclosure, wherein the substrate transfer chamber is in communication with a plurality of processing stations. Some embodiments of the invention have combined the FI and the substrate transfer chamber, and therefore, have eliminated a substrate transfer step (transfer of the substrate between the FI and the substrate transfer chamber). Furthermore, although the illustration of an embodiment of the invention in FIG. 1 depicts 4 processing modules 102 in communication with FI 101, the invention is not limited to any particular number of processing modules 102 that may be placed in communication with the FI. Further, although not illustrated in FIG. 1, FI 101 may include or be in communication with additional chambers, such as an annealing chamber, a metrology chamber, or other chamber/cell that may be useful in a semiconductor processing system.

Figure 2:
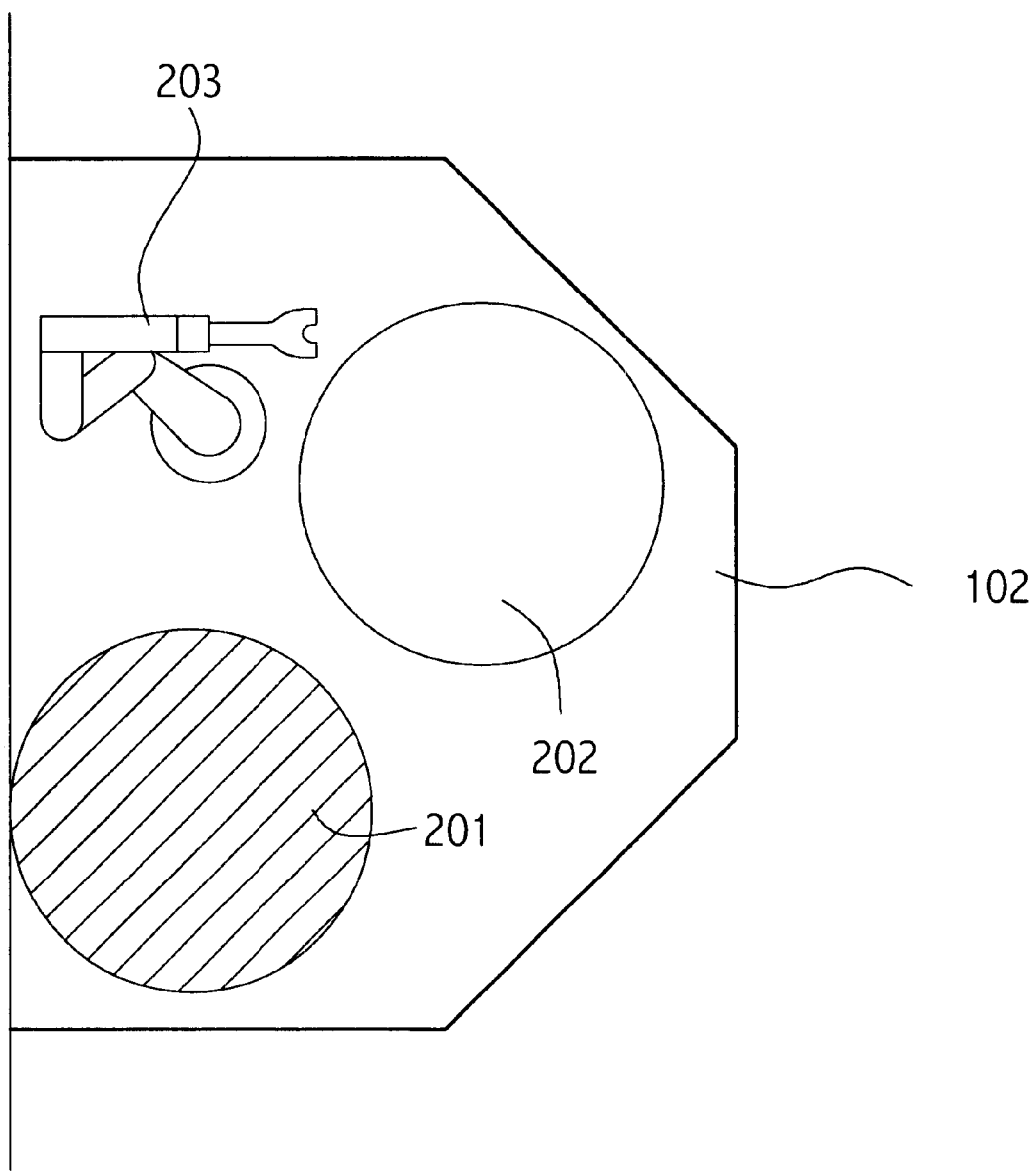
FIG. 2 illustrates a plan view of an exemplary processing module of the invention.

FIG. 2 illustrates a plan view of an exemplary processing module 102 of the invention. In one embodiment of the invention, processing module 102 may include a processing module transfer robot 203, a substrate pretreatment/post treatment cell 201, and a substrate processing cell 202. The processing module substrate transfer robot 203 is generally configured to transport one or more substrates between the pretreatment cell 201, the processing cell 202, and the FI robot 104 in any order, i.e., robot 203 may access any of the three components (generally only the pretreatment cell 201 and processing cell 202, however it may access the FI robot 104 or the optional handoff pad or station) in any order without limit. Additionally, a valve or movable partition may be positioned between FI 101 and processing module 102. Therefore, in this configuration, processing module 102 may receive a dry substrate from FI robot 104 for processing. The dry substrate may first be received at the pretreatment cell 201, where any pre-processing steps may be conducted on the substrate. Exemplary preprocessing steps may include rinsing, cleaning, or otherwise treating the surface of a substrate with a fluid or gas. Once the preprocessing steps are completed in cell 201, the substrate may be removed from pretreatment cell 201 and transported via robot 203 to processing cell 202, where processing steps are conducted on the substrate. Exemplary processes that may be conducted in processing cell 201 include, but are not limited to, electrochemical deposition, electroless deposition, electrochemical deplating, and other wet processing-type semiconductor fabrication processes. Once the processing steps are completed in cell 202, robot 203 once again may transport the substrate to treatment cell 201, where post treatment processes may be conducted on the substrate. Exemplary post treatment steps include cleaning, edge bead removal, rinsing, drying, and other processes known to be conducted on semiconductor substrates after a wet processing step. Once the post treatment processes are completed, the substrate may be removed from processing module 102 by FI robot 104.

Figure 3:
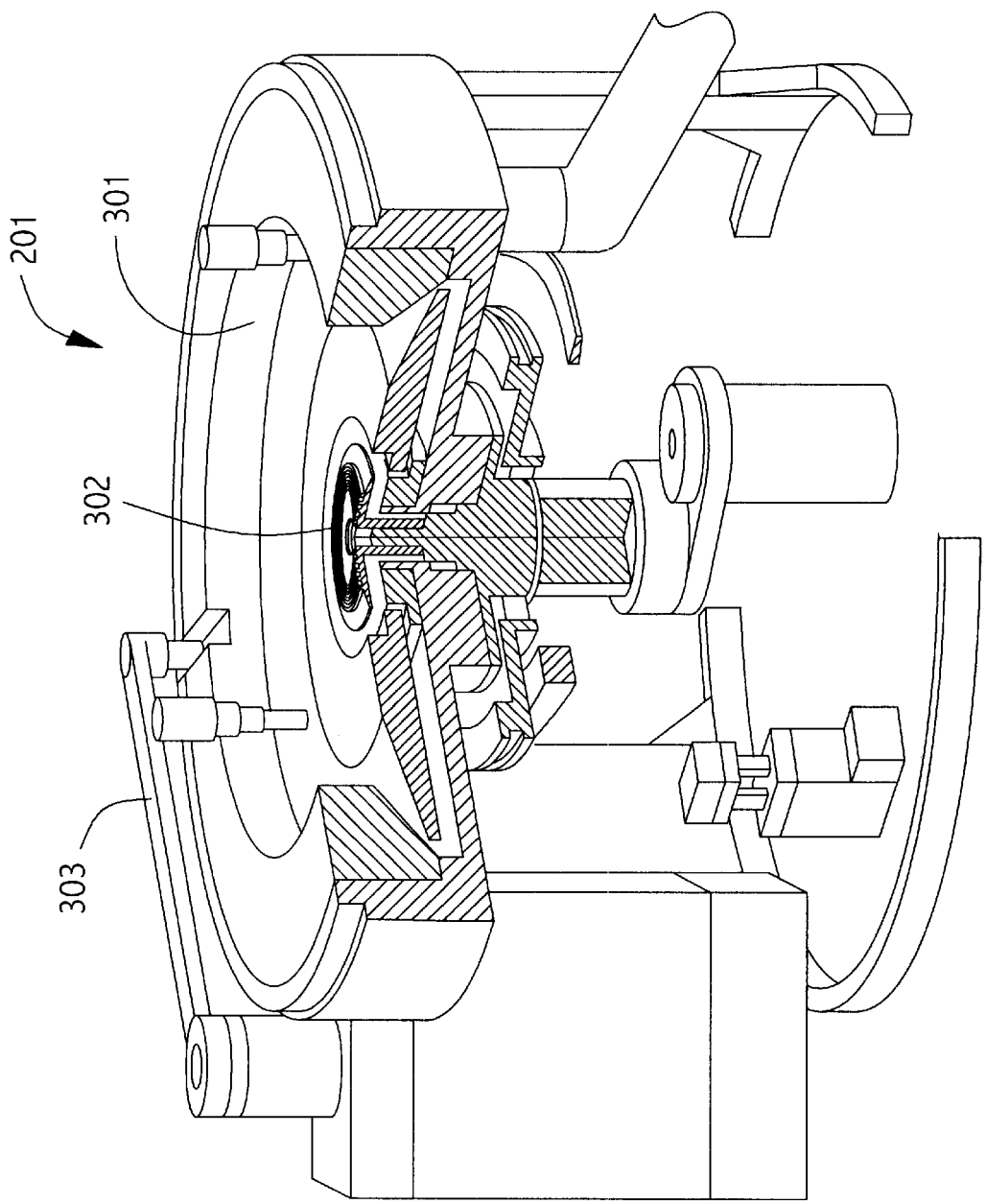
FIG. 3 illustrates a perspective and partial sectional view of an exemplary pretreatment/post treatment cell of the invention.

FIG. 3 illustrates a perspective and partial sectional view of an exemplary pretreatment/post treatment cell 201 of the invention. The pretreatment/post treatment cell 201 may generally include a cell configured to rinse or otherwise treat a substrate with a processing fluid before or subsequent to a substrate processing step conducted in the adjacent processing cell 202. The exemplary cell 201 includes a processing basin 301 that has a substrate support member 302 positioned in a bottom portion thereof. The substrate support member 302, as illustrated in FIG. 3, is generally configured to support a substrate in a face up configuration, in a configuration wherein the working or production surface of the substrate is facing upward or away from the support member 302. Further, substrate support member 302 is configured to secure a substrate thereto and rotate. Cell 201 further includes a pivotally mounted fluid dispensing arm 303 configured to selectively dispense a processing fluid onto the production surface of a substrate positioned on the substrate support member. For example, in a rinsing process, pivotal arm 303 may be pivoted to the center of the substrate and a rinsing solution, such as DI, for example, may be dispensed from a fluid dispensing nozzle positioned at a distal end of arm 303. The substrate support member 302 may be rotated and the arm may then be pivoted radially outward, which generally operates to rinse the substrate from the center outward. Alternatively, if an edge bead removal process is to be conducted in cell 201, then the substrate may be secured to the substrate support member 302 and rotated, while arm 303 is positioned to precisely dispense an etchant onto a perimeter portion of the rotating substrate. The etchant may then operate to remove material from the edge and bevel of the substrate. It is to be noted, however, that embodiments of the invention are not limited to any particular substrate processing configurations. For example, although a face up processing configuration is illustrated, embodiments of the invention are not intended to be limited to this configuration, as embodiments of the present invention contemplate that both face up or face down-type configurations may be implemented without departing from the scope of the invention.

The pretreatment/post treatment cell 201 may further be configured to dry one or more substrates, through, for example, a spin rinse dry process, as is generally known in the semiconductor art. As such, exemplary processes that may be conducted by the pretreatment/post treatment cell include, but are not limited to, prerinsing substrates, pre-treating substrates before plating, removing contaminant layers from substrates, spin rinse drying substrates, conducting edge bead removal processes on substrates, and other processes that are known in the semiconductor art. In embodiments of the invention wherein system 100 is an electrochemical plating cell, pretreatment/post treatment cell may generally be configured to prerinse or pretreat a substrate to be plated with a rinsing or pretreatment solution prior to the substrate being transferred to the adjacent processing cell, which would be configured as an electro-chemical plating cell. Exemplary pretreatment processes for electrochemical plating systems may include prerinsing with deionized water (DI), pretreating the substrate surface with a fluid configured to form or remove an oxide layer on the substrate surface, pretreating the surface of the substrate with a fluid configured to enhance some portion of a subsequent plating process, or other pretreatment processes known in the semiconductor art. Further, the pretreatment/post treatment cell may be configured to receive substrates from the adjacent plating cell for processing after the plating process is complete. Exemplary post treatment processes include rinsing the substrate to remove residual plating solution from the substrate surface, conducting an edge bead removal or bevel clean process, and/or spin rinse drying the substrate.

Figure 4:
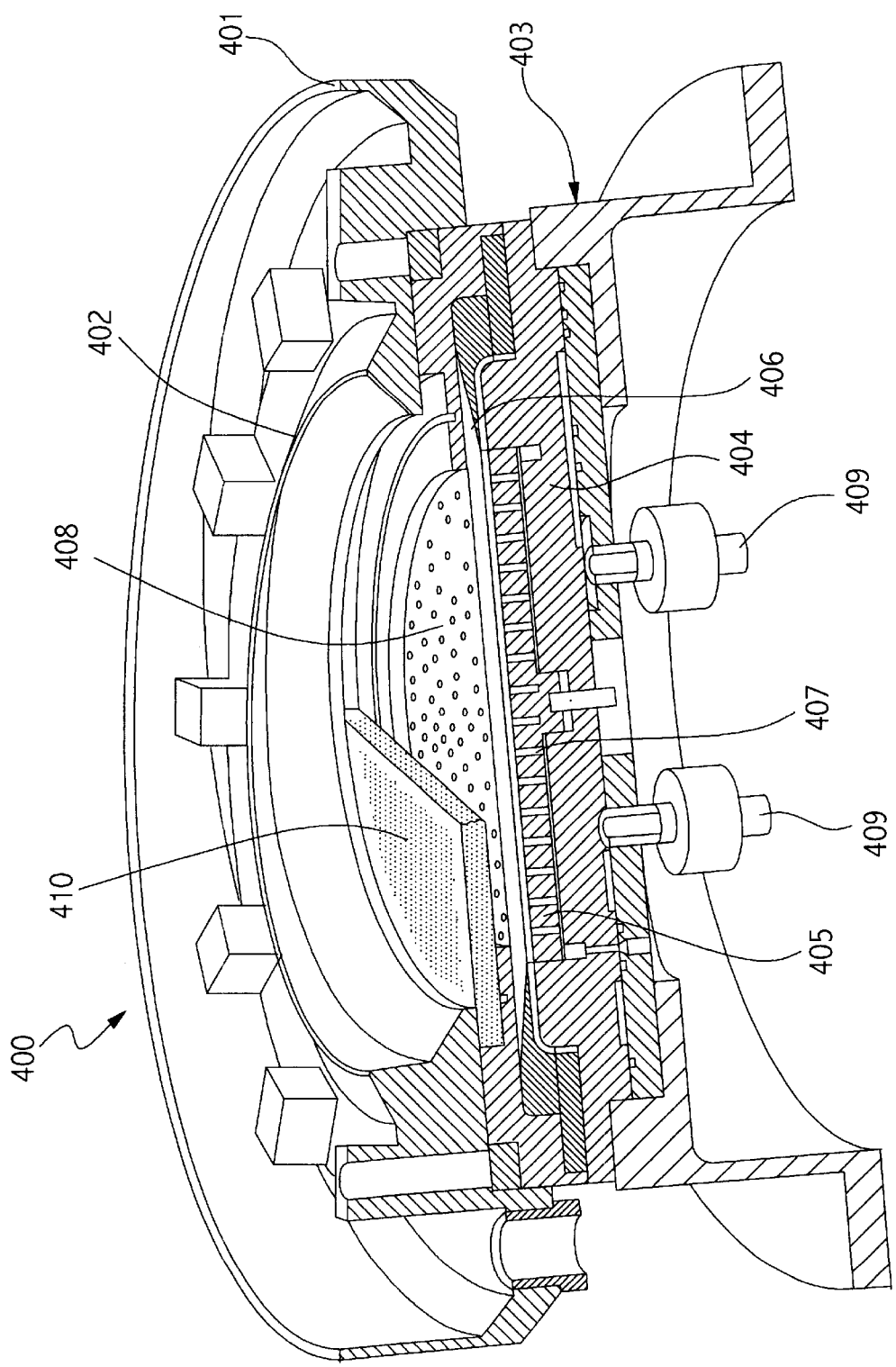
FIG. 4 illustrates a perspective and partial sectional view an exemplary plating cell of the invention.

FIG. 4 illustrates a perspective and partial sectional view of an exemplary electrochemical plating cell 400 of the invention. Plating cell 400 generally includes an outer basin 401 and an inner basin 402 positioned within outer basin 401. Inner basin 402 is generally configured to contain a plating solution that is used to plate a metal, e.g., copper, onto a substrate during an electrochemical plating process. During the plating process, the plating solution is generally continuously supplied to inner basin 402 (at about 1–5 gallons per minute for a 10 liter plating cell, for example), and therefore, the plating solution continually overflows the uppermost point of inner basin 402 and runs into outer basin 401. The overflow plating solution is then collected by outer basin 401 and drained therefrom for recirculation into basin 402. As illustrated in FIG. 4, plating cell 400 is generally positioned at a tilt angle, i.e., the frame portion 403 of plating cell 400 is generally elevated on one side such that the components of plating cell 400 are tilted between about 3° and about 30°. Therefore, in order to contain an adequate depth of plating solution within inner basin 402 during plating operations, the uppermost portion of basin 102 may be extended upward on one side of plating cell 400, such that the uppermost point of inner basin 402 is generally horizontal and allows for contiguous overflow of the plating solution supplied thereto around the perimeter of basin 402.

The frame member 403 of plating cell 400 generally includes an annular anode base member 404 secured to frame member 403. Since frame member 403 is elevated on one side, the upper surface of base member 404 is generally tilted from the horizontal at an angle that corresponds to the angle of frame member 403 relative to a horizontal position. Base member 404 includes an annular or disk shaped recess formed therein, the annular recess being configured to receive a disk shaped anode member 405. Base member 404 further includes a plurality of fluid inlets/drains 409 positioned on a lower surface thereof. Each of the fluid inlets/drains 409 are generally configured to individually supply or drain a fluid to or from either the anode compartment or the cathode compartment of plating cell 400. Anode member 405 generally includes a plurality of slots 407 formed therethrough, wherein the slots 407 are generally positioned in parallel orientation with each other across the surface of the anode 405. The parallel orientation allows for dense fluids generated at the anode surface to flow downwardly across the anode surface and into one of the slots 407. Plating cell 400 further includes a membrane support assembly 406. Membrane support assembly 406 is generally secured at an outer periphery thereof to base member 404, and includes an interior region 408 configured to allow fluids to pass therethrough via a sequence of oppositely positioned slots and bores. The membrane support assembly may include an o-ring type seal positioned near a perimeter of the membrane, wherein the seal is configured to prevent fluids from traveling from one side of the membrane secured on the membrane support 406 to the other side of the membrane.

In operation, the plating cell 400 of the invention provides a small volume (electrolyte volume) processing cell that may be used for copper electrochemical plating processes, for example. Plating cell 400 may be horizontally positioned or positioned in a tilted orientation, i.e., where one side of the cell is elevated vertically higher than the opposing side of the cell. If plating cell 400 is implemented in a tilted configuration, then a tilted head assembly and substrate support member may be utilized to immerse the substrate at a constant immersion angle, i.e., immerse the substrate such that the angle between the substrate and the upper surface of the electrolyte does not change during the immersion process. Further, the immersion process may include a varying immersion velocity, i.e., an increasing velocity as the substrate becomes immersed in the electrolyte solution. The combination of the constant immersion angle and the varying immersion velocity operates to eliminate air bubbles on the substrate surface.

Assuming a tilted implementation is utilized, a substrate is first immersed into a plating solution contained within inner basin 402. Once the substrate is immersed in the plating solution, which generally contains copper sulfate, chlorine, and one or more of a plurality of organic plating additives (levelers, suppressors, accelerators, etc.) configured to control plating parameters, an electrical plating bias is applied between a seed layer on the substrate and the anode 405 positioned in a lower portion of plating cell 400.

The electrical plating bias generally operates to cause metal ions in the plating solution to deposit on the cathodic substrate surface. The plating solution supplied to inner basin 402 is continually circulated through inner basin 402 via fluid inlet/outlets 409. More particularly, the plating solution may be introduced in plating cell 400 via a fluid inlet 409. The solution may travel across the lower surface of base member 404 and upward through one of slots 407. The plating solution may then be introduced into the cathode chamber via a channel formed into plating cell 400 that communicates with the cathode chamber at a point above membrane support 406. Similarly, the plating solution may be removed from the cathode chamber via a fluid drain positioned above membrane support 406, where the fluid drain is in fluid communication with one of fluid drains 409 positioned on the lower surface of base member 404. For example, base member 404 may include first and second fluid apertures positioned on opposite sides of base member 404. The oppositely positioned fluid apertures may operate to individually introduce and drain the plating solution from the cathode chamber in a predetermined direction, which also allows for flow direction control. The flow control direction provides control over removal of light fluids at the lower membrane surface, removal of bubbles from the anode chamber, and assists in the removal of dense or heavy fluids from the anode surface via the channels 402 formed into base 404.

Once the plating solution is introduced into the cathode chamber, the plating solution travels upward through diffusion plate 410. Diffusion plate 410, which is generally a ceramic or other porous disk shaped member, generally operates as a fluid flow restrictor to even out the flow pattern across the surface of the substrate. Further, the diffusion plate 410 operates to resistively damp electrical variations in the electrochemically active area the anode or cation membrane surface, which is known to reduce plating uniformities. Additionally, embodiments of the invention contemplate that the ceramic diffusion plate 410 may be replaced by a hydrophilic plastic member, i.e., a treated PE member, an PVDF member, a PP member, or other material that is known to be porous and provide the electrically resistive damping characteristics provided by ceramics. However, the plating solution introduced into the cathode chamber, which is generally a plating catholyte solution, i.e., a plating solution with additives, is not permitted to travel downward through the membrane (not shown) positioned on the lower surface of membrane support assembly 406 into the anode chamber, as the anode chamber is fluidly isolated from the cathode chamber by the membrane. The anode chamber includes separate individual fluid supply and drain sources configured to supply an anolyte solution to the anode chamber. The solution supplied to the anode chamber, which may generally be copper sulfate in a copper electrochemical plating system, circulates exclusively through the anode chamber and does not diffuse or otherwise travel into the cathode chamber, as the membrane positioned on membrane support assembly 406 is not fluid permeable in either direction.

Additionally, the flow of the fluid solution (anolyte, i.e., a plating solution without additives, which may be referred to as a virgin solution) into the anode chamber is directionally controlled in order to maximize plating parameters. For example, anolyte may be communicated to the anode chamber via an individual fluid inlet 409. Fluid inlet 409 is in fluid communication with a fluid channel formed into a lower portion of base member 404 and the fluid channel communicates the anolyte to apertures configured to circulate the respective fluids to the respective chambers above and below the membrane. Similarly, a catholyte solution, i.e., a solution with plating additives therein, may be separately communicated to the cathode compartment, i.e., the volume above the membrane.

Therefore, in operation, system 100 may be used to provide a substrate to a processing module 102 in a dry form, i.e., the surface of the substrate is not wet from a previous wet processing step. For example, substrates having a seed layer deposited thereon may be introduced into system 100 via cassettes 103. Robot 104 may operate to deliver the substrate having a seed layer formed thereon (a dry substrate) to processing module 102. Module 102 generally receives the substrate in the preprocessing cell 201, where the substrate may be rinsed and/or cleaned in accordance with a specific processing recipe. Once the desired preprocessing steps are completed in cell 201, the substrate is generally transferred to the processing cell 202 via robot 203. In the processing cell the substrate may be plated, deplated, or otherwise processed. Once the substrate is processed in cell 202, it is generally transferred back to cell 201 for post processing steps. Exemplary post processing steps include rinsing, cleaning, edge bead removal, drying, and/or other known semiconductor post processing steps. However, one step generally conducted in cell 201 is a spin rinse dry process, as system 100 is generally configured to supply a dry substrate to processing module 102 and receive a dry processed substrate from processing module when the processing steps are complete. As such, FI 101 is generally maintained in a clean and dry manner and is not likely to contaminate other substrates traveling therethrough for processing in other processing modules 102.

Another advantage provided by system 100 is that processing modules 102 are removable, and more particularly, processing modules are interchangeable. Therefore, system 100 has the ability to shut down an individual processing module 102 when a fault occurs, service or remove the faulty processing module 102 from FI 101, and/or replace it with a new processing module 102, without interrupting the operation of system 100. Additionally the removability of modules 102 allows system 100 to be scalable, as additional processing modules may be added to the interface section as needed. For example, embodiments of the invention contemplate that annealing chambers or modules, electroless chambers or modules, polishing modules or chambers, other electrolytic processing modules, and/or chemical polishing modules.

While the foregoing is directed to embodiments of the present invention, other and further embodiments of the invention may be devised without departing from the basic scope thereof, and the scope thereof is determined by the claims that follow

What is claimed is:

1. A substrate processing system, comprising:
   an interface section having at least one first substrate transfer robot positioned therein; and
   at least one processing module in communication with the interface section, the at least one processing module having a pretreatment and post treatment cell, a processing cell selected from the group consisting of an electrochemical cell and an electroless cell, and a second substrate transfer robot positioned therein.

2. The substrate processing system of claim 1, wherein the interface section comprises a factory interface configured communicate with at least one substrate cassette and each of the at least one processing modules.

3. The substrate processing system of claim 1, wherein the first substrate transfer robot comprises at least one linear track robot.

4. The substrate processing system of claim 1, wherein the interface section further comprises at least one of an annealing station and a metrology station.

5. The substrate processing system of claim 1, wherein the pretreatment and post treatment cell comprises a fluid processing cell configured to selectively dispense pretreatment fluids and post treatment fluids on a substrate.

6. The substrate processing system of claim 5, wherein pretreatment fluids include rinsing solutions, cleaning solutions, and oxide removal solutions.

7. The substrate processing system of claim 1, wherein the pretreatment and post treatment cell comprises a combination spin rinse dry cell and a bevel clean cell.

8. The substrate processing system of claim 1, wherein the processing cell is an electrochemical processing cell.

9. The substrate processing system of claim 1, wherein the processing cell is an electroless processing cell.

10. The substrate processing system of claim 1, wherein the second substrate transfer robot is configured to transport substrates between the processing cell, the pretreatment and post treatment cell, and the first substrate transfer robot.

11. The substrate processing system of claim 1, wherein the at least one processing module comprises at least one of a deposition module, a chemical mechanical polishing module, an anneal module, an edge bead removal module, and a rinse clean module.

12. The substrate processing system of claim 1, wherein each of the at least one processing modules are detachable from the substrate processing system.

13. The substrate processing system of claim 12, wherein the substrate processing system is scalable.

14. An electrochemical processing system, comprising:
    a factory interface having a substrate transfer robot positioned therein, the factory interface being configured to communicate with at least one substrate containing cassette; and
    at least one substrate processing module in detachable communication with the factory interface, each of the at least one substrate processing modules including a pretreatment/post treatment cell and an electrochemical processing cell.

15. The processing system of claim 14, wherein the substrate transfer robot comprises a linear track-type robot configured to access each of the substrate processing modules.

16. The processing system of claim 14, wherein the at least one substrate processing module further comprises a second substrate transfer robot positioned therein, the second substrate transfer robot being configured to transfer substrates between the substrate transfer robot in the factory interface, the pretreatment/post treatment cell, and the electrochemical processing cell.

17. The processing system of claim 14, wherein the pretreatment/post treatment cell comprises a fluid processing cell configured to conduct at least one of rinsing, cleaning, edge bead removal, and spin rinse drying.

18. The processing system of claim 14, wherein the at least one processing module is detachable from the factory interface.

19. The processing system of claim 14, wherein the electrochemical processing cell comprises:
    a fluid basin configured to contain a plating solution therein;
    an anode positioned in a lower portion of the fluid basin;
    a membrane positioned above the anode;
    a diffusion plate positioned above the membrane; and
    a first fluid inlet configured to supply a catholyte solution to a volume above the membrane and a second fluid inlet configured to supply an anolyte solution to a volume below the membrane.

20. A method for processing a substrate, comprising:
    introducing a substrate into an interface section of a substrate processing system;
    transferring the substrate to a processing module in communication with the interface section of the substrate processing system;
    conducting at least one of a pretreatment process and a post treatment process on the substrate in a pretreatment and post treatment cell positioned within the processing module; and
    conducting a processing step on the substrate in a processing cell selected from the group consisting of an electrochemical cell and an electroless cell positioned in the processing module.

21. The method of claim 20, wherein the interface section further comprises at least one of an annealing station and a metrology station.

22. The method of claim 20, wherein the pretreatment and post treatment cell comprises a combination spin rinse dry cell and a bevel clean cell.

23. The method of claim 20, wherein the processing cell is an electrochemical processing cell.

24. The method of claim 20, wherein the processing cell is an electroless processing cell.

25. The method of claim 20, wherein the pretreatment and post treatment cell comprises a fluid processing cell configured to selectively dispense pretreatment fluids and post treatment fluids on a substrate, and wherein the pretreatment fluids include rinsing solutions, cleaning solutions, and oxide removal solutions.

* * * * *